(12) United States Patent
Chadda

(10) Patent No.: US 7,998,877 B1
(45) Date of Patent: Aug. 16, 2011

(54) DIFFRACTION GRATING IN CONJUNCTION WITH REDUCED THICKNESS TO INCREASE EFFICIENCY OF SOLAR CELLS

(76) Inventor: Saket Chadda, San Jose, CA (US)

( * ) Notice: Subject to any disclaimer, the term of this patent is extended or adjusted under 35 U.S.C. 154(b) by 698 days.

(21) Appl. No.: 12/151,071

(22) Filed: May 2, 2008

(51) Int. Cl.
*H01L 21/302* (2006.01)
*H01L 21/461* (2006.01)

(52) U.S. Cl. ........ 438/753; 438/584; 438/604; 438/606; 257/E21.126; 257/E21.127; 257/E21.129; 257/E21.152; 257/E21.217; 257/E21.218; 257/E21.229

(58) Field of Classification Search .................. 438/753, 438/311, 603, 604, 606, 608, 584, 508; 257/E21.126, E21.127, E21.129, E21.152, 257/E21.218, E21.229
See application file for complete search history.

(56) References Cited

U.S. PATENT DOCUMENTS

| 5,067,985 | A * | 11/1991 | Carver et al. | 136/255 |
|---|---|---|---|---|
| 6,340,788 | B1 * | 1/2002 | King et al. | 136/261 |
| 6,645,833 | B2 * | 11/2003 | Brendel | 438/458 |
| 7,109,517 | B2 * | 9/2006 | Zaidi | 257/22 |

OTHER PUBLICATIONS

D. M. Chapin, C. S. Fuller, and G. L. Pearson (May 1954). "A New Silicon p-n Junction Photocell for Converting Solar Radiation into Electrical Power". Journal of Applied Ph.
Alferov, Zh. I., V. M. Andreev, M. B. Kagan, I. I. Protasov, and V. G. Trofim, 1970, "Solar-energy converters based on p-n AlxGa12xAs-GaAs heterojunctions," Fiz. Tekh. Po.
Romeo, N. et al., "A highly efficient and stable CdTe/CdS thin film solar cell", Solar Energy Materials and Solar Cells, Elsevier Science Publishers, Amsterdam, The Netherl.
Ben G. Streetman, "Solid State Electronic Devices", 3rd edition, Prentice Hall, 1990, 21-217.

* cited by examiner

*Primary Examiner* — David Nhu

(57) ABSTRACT

This invention describes a method of making solar cells wherein the efficiency of the solar cell is enhanced by defining a diffraction grating either on top of the cell or at the bottom of the cell. The diffraction grating spacing is defined such that it bends one or more wavelengths of the incident radiation thereby making those wavelengths traverse in the direction of the plane of the device. The addition of a diffraction grating is done in conjunction with thinning down the cell such that the minority carriers generated (holes and electrons) have a higher probability of being collected. The combined effect of the diffraction grating and the reduced thickness in the solar cell increases the efficiency of the solar cell.

31 Claims, 3 Drawing Sheets

Figure 1:
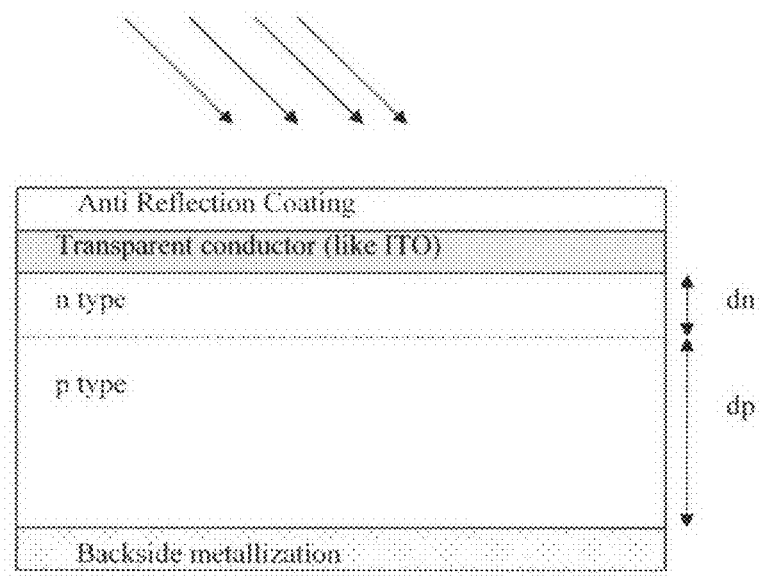

DIFFRACTION GRATING IN CONJUNCTION WITH REDUCED THICKNESS TO INCREASE EFFICIENCY OF SOLAR CELLS

CROSS-REFERENCES TO RELATED APPLICATIONS n/a

STATEMENT REGARDING FEDERALLY SPONSORED RESEARCH OR DEVELOPMENT n/a

THE NAMES OF THE PARTIES TO A JOINT RESEARCH AGREEMENT n/a

INCORPORATION-BY-REFERENCE OF MATERIAL SUBMITTED ON A COMPACT DISC n/a

BACKGROUND OF THE INVENTION

1. Field of the Invention

The present invention is related, generally, to solar cells. More particularly, the invention relates to a method of making solar cells such that the efficiency of the solar cell is increased. This is performed by creating one dimensional or two dimensional diffraction gratings on either the substrate or the solar cell material itself to diffract particular wavelengths of the incident radiation into the plane of the solar device such that the thickness of the solar cell is reduced and hence the distance the minority carriers have to traverse within the semiconductor material is reduced thereby increasing the collection probability of the minority carriers generated.

2. Description of the Related Art

Semiconductor based solar cells have been around for a while [1]. Initially these were based on silicon p-n homogeneous junctions and were primarily in use for space applications. More recently, solar cells based on III-V materials and various variations of silicon solar cells have been developed [2-3]. Pricing, availability of oil as well as the polluting effects of oil-based energy is promoting the use of alternate sources of energy such as solar cells. Solar cells are being made using homogenous p-n junctions as in the case of silicon-based solar cells as well as heterogeneous junctions as in the case of CdTe, GaAs, and Copper Indium Gallium Selenide based solar cells. Solar cells operate by using a semiconductor material with an energy gap between the conduction and valence bands. Electromagnetic radiation such as visible light has waves of various wavelengths in a continuum. As these waves enter a semiconductor material, photons with energy greater than the energy band-gap of the semiconductor material are absorbed and electrons from the valence band are excited into the conduction band leaving a hole behind in the valance band. Electrons and holes are collected at each end of the device by electrodes in order to generate electricity. While traversing the thickness of the cell some of these photon generated electrons and holes interact with the semiconductor material itself and are re-absorbed or lost. The design of a solar cell is typically a compromise between higher absorption, which increases with increasing thickness of the active material and higher collection of the minority carriers, which decreases, with increasing thickness of the active material [4]. Increasing the layer thickness is good for increasing absorption of the incident radiation. However, increasing the thickness of the layers also reduces the probability of the minority carriers created to be collected. Hence, based on the particular solar cell, an optimum thickness is chosen to maximize the efficiency of the cell.

BRIEF SUMMARY OF THE INVENTION

Semiconductor based solar cells are made on a variety of substrates (glass, Si, GaAs etc) and with a variety of materials (CdTe/CdS, Si, GaAs/AlGaAs, Copper Indium Gallium Selenide etc). Most solar cells have a p-doped layer (or sometimes intrinsic layer) and an n doped layer. As electromagnetic waves are absorbed in these semiconductor layers, electrons are excited from the valence band to the conduction band and holes are created in the valence band. These electrons and holes have a finite lifetime. The lifetime of the electrons and holes is dependent on the material properties of the material they are propagating in. As they are being collected some of these electrons and holes interact with the media and re-combine or get trapped or lost altogether. Hence efficiency of a solar cell, defined broadly as a ratio of number of electrons/holes collected to the number of photons incident on the solar cell gets reduced. Design of a solar cell is typically done such that diffusion length of the minority carrier (electron in p region and hole in n region) is larger than the thickness of the solar cell. This is done such that holes generated by absorption in the n region and electrons generated in the p region are able to be collected. In general the thinner the n and p region (even when these are significantly smaller than the minority carrier diffusion length, the better the probability of the generated species (electrons or holes) to be collected. However, as the n and p region are made thinner, the smaller the probability that the incident photon gets actually absorbed to create electrons and holes. Hence typically, the thickness of the n and p region in a solar cell is a compromise between the above two effects of being able to absorb more of the incident radiation and being able to collect the electrons and holes generated by the absorption before they are lost due to interaction with the media they are traveling in. This invention allows the active region thickness to be reduced substantially without suffering from the reduced absorption. This is performed by creating a diffraction grating. The diffraction grating spacing is designed to bend the incident light upto ninety degrees thereby allowing the incident radiation to be absorbed in the semiconductor material while traveling the lateral length of the material (as opposed to passing through it). Such a grating allows the thickness to be reduced thereby reducing the probability of the generated electrons and holes to be re-absorbed or lost. Such a device enhances the efficiency of the cell. Further, a two-dimensional grating can be used with spacing equal in both directions or un-equal in the two directions. The spacing of the one-dimensional grating can be less than, or equal to the wavelength corresponding to the energy gap of the semiconductor. Further the spacing of the two-dimensional grating in x and y direction can be equal or un-equal to each other. Having an un-equal spacing in x and y direction allows two different wavelengths to be bent in the plane of the device more efficiently. In this case as well, the grating spacing can be less than or equal to the wavelength corresponding to the energy gap of the absorbing semiconductor material.

BRIEF DESCRIPTION OF THE SEVERAL VIEWS OF THE DRAWING(S)

FIG. 1 Schematic of a standard silicon solar cell showing a n and p type material of thickness do and dp as well the back-side metallization, transparent front side metallization, and an anti reflection coating with incident radiation.

Figure 2:
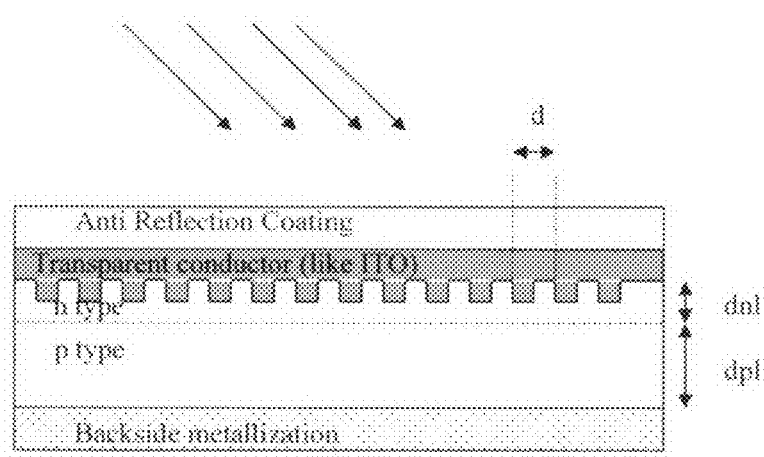

FIG. 2 Schematic of a solar cell with a one-dimensional diffraction grating, which is etched into the n type material itself. The spacing of the grating (d) is designed to bend the incident light by a certain angle thereby allowing reduction of the thickness of the n and p type materials thereby enhancing the efficiency of the solar cell.

Figure 3A:
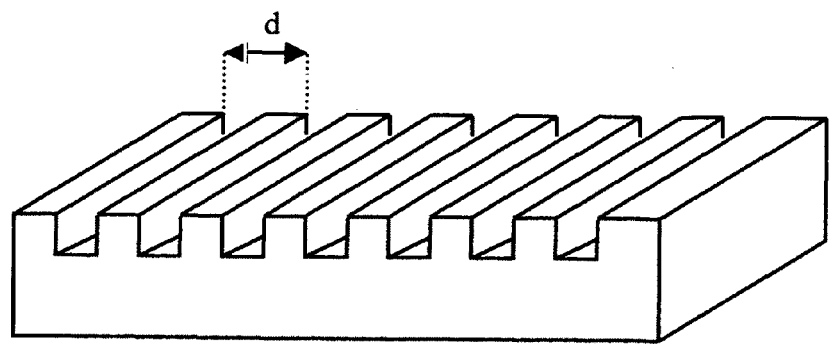

FIG. 3a Schematic illustrating a one-dimensional grating with spacing d

Figure 3B:
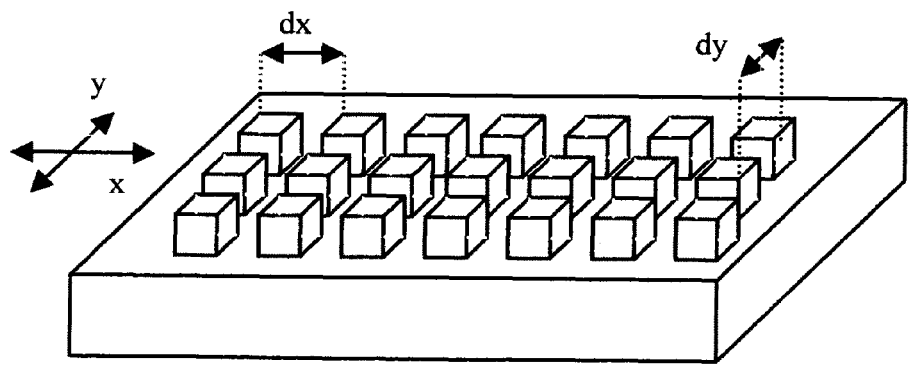

FIG. 3b Schematic illustrating a two-dimensional grating with spacing dx in the x direction and dy in the y direction.

Figure 4:
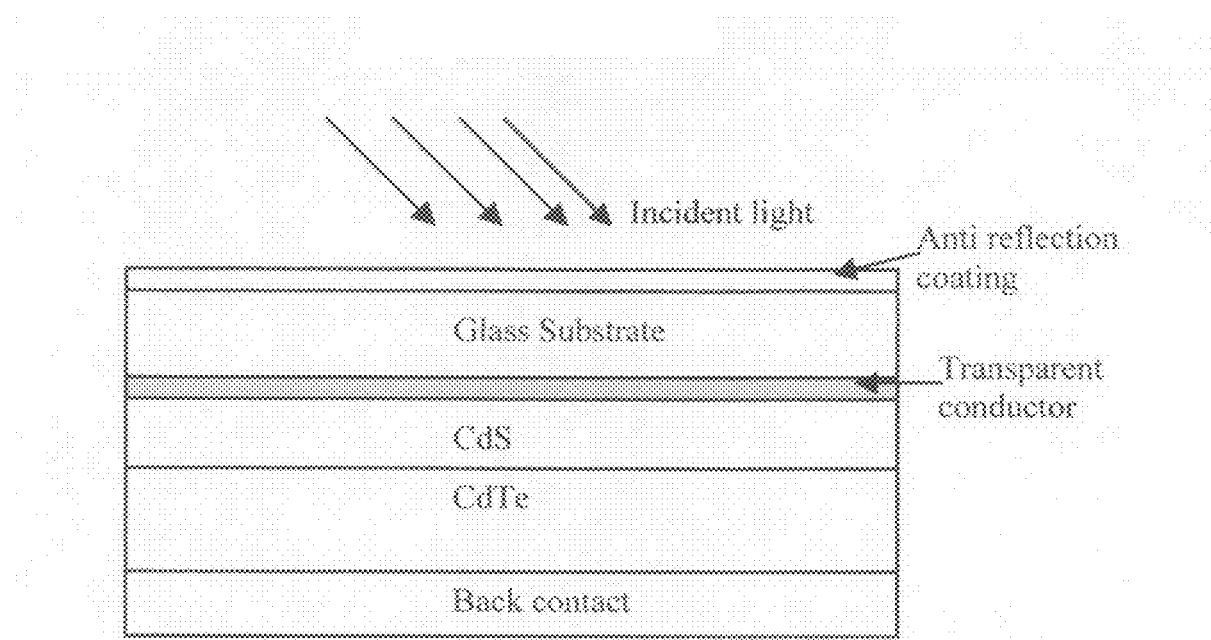

FIG. 4 Schematic illustrating a typical CdS/CdTe based solar cell deposited on a glass substrate. In a typical CdTe based solar cell CdS thickness is typically 0.2-0.5 microns and the CdTe thickness is typically 1.4-2 microns.

Figure 5:
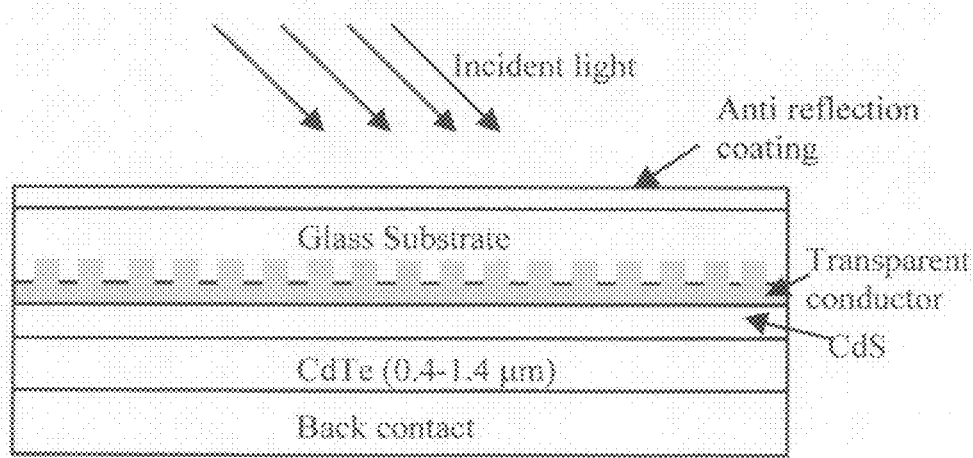

FIG. 5 Schematic illustrating a CdS/CdTe based solar cell in which the glass panel has a diffraction grating etched into it to diffract the incident light into the plan of the device and it has reduced thickness of the CdS and CdTe layers to decrease recombination effects resulting in increased efficiency of the solar cell.

DETAILED DESCRIPTION OF THE INVENTION

The following description is of exemplary embodiments only and is not intended to limit the scope, applicability or configuration of the invention in any way. Rather, the following description provides an illustration for implementing exemplary embodiments of the invention. Various changes to the described embodiments may be made in the function and arrangement of the elements described without departing from the scope of the invention as set forth in the appended claims.

FIG. 1 is a schematic of a typical silicon semiconductor homogeneous solar cell. In such a solar cell a group five element is doped to create an n type area on a p type substrate. Further, a transparent conductor is deposited on the entire front surface (or a non-transparent conductor with windows to allow for the electromagnetic spectra to be absorbed by the device) followed by an anti-reflection coating to minimize radiation lost due to reflection of the incident light. Absorption of incident light takes place in both the n and p type regions. The thickness of the n type and p type region is a compromise between maximizing the absorption of incident light and increasing the probability of actually collecting the electrons and holes created by the absorption such that efficiency of the cell is maximized. Typical thickness of the n type layer is 1-3 microns and the typical thickness of the p type layer is anywhere between 10-200 microns.

FIG. 2 shows one example of this invention wherein a one dimensional diffraction grating is etched into the top surface of the n type material with a spacing (pitch) equal to or slightly less than the wavelength corresponding to the energy gap of the semiconductor material (silicon in this case). This spacing is calculated by the combination of the two equations $E=hc/\lambda$ and $n\lambda=2d \sin(\phi)$ where E is the energy gap of the semiconductor (1.11 eV in the case of silicon), h is the Planck's constant, $\lambda$, is the wavelength of incident radiation, n is the order of diffraction, d is the spacing of the diffraction grating, and $\phi$ is the angle by which the incident radiation is bent. It must be noted here that for normally incident radiation, the ideal $\phi$ is 90 degrees, however, radiation incident on the solar cell during the day may not be normal and hence it may be desired to have the grating pitch slightly different from the above equations. In this configuration, the thickness of the n and p type material is reduced substantially from the thickness used in the example in FIG. 1. The n type thickness is reduced to 0.05-1 microns in conjunction with the diffraction grating. The p type thickness is also reduced to 5-100 microns.

FIG. 3a and b show plan views of a one-dimensional and two dimensional grating. For the case of the two-dimensional grating the spacing in x and y directions can be equal to each other or different from each other. When the spacing in x and y directions are different from each other, the spacing in the two directions are tailored to correspond to the band-gap of the two materials.

FIG. 4 is a schematic diagram of a typical CdTe based solar cell in which a glass panel with a conductive transparent layer is used as a substrate to deposit thin films of CdS followed by CdTe followed by copper chloride to passivate grain boundaries and finally a back side contact layer.

FIG. 5 shows one example of this invention wherein a one dimensional diffraction grating is defined on the glass panel used as a substrate to deposit thin film solar cells like amorphous or polycrystalline silicon or CdTe/CdS based solar cells or CIGS based solar cells. In such a configuration, the diffraction grating with the spacing calculated based on the desire to diffract radiation by close to ninety degrees defined/etched on the glass panel itself. As light passes through the glass panel it gets diffracted into the plane of the device. FIG. 5 shows the example of using CdTe/CdS based solar cell on glass panel with diffraction grating, however, this invention comprehends such an application for all solar materials typically deposited on glass or other transparent substrates. Such materials include amorphous and/or polycrystalline materials as well as CIGS based solar devices. The key point of this invention is that the thickness of the deposited layers is reduced without suffering from reduced absorption while decreasing recombination thereby increasing the efficiency of the solar cell. In this specific example for instance typical thickness of CdS is 0.2-0.5 microns and the typical thickness of CdTe is 1.4-2.0 microns. With the addition of the diffraction grating in the glass substrate or actually making the grating out of the front contact material itself, the thickness of the CdS is be reduced to 0.02-0.2 microns and the thickness of the CdTe is reduced to 0.5-1.5 microns. In this manner, the distance, the minority carriers generated by the absorption have to traverse before being collected by the front or back contact is substantially reduced without reduced absorption. In fact absorption may actually increase as compared to a standard cell in such a configuration in addition to the increase of efficiency of the solar cell.

What is claimed is:

1. A method for making a solar cell with increased efficiency in which a homogeneous silicon based solar cell is made in a standard way with a n-p junction and a conducting layer on a-top surface and a bottom surface except that the top surface of the solar cell has a diffraction grating whose spacing is designed to diffract a wavelength equal to or slightly lower than a wavelength corresponding to an energy gap of the semiconductor material and the thickness of the semiconductor layers is reduced such that electrons and holes generated by an absorption of a radiation do not have to traverse large distances in order to be collected and get trapped or lost in a process of being collected due to a fact that an incident radiation is being diffracted in a plane of a device.

2. The method for making a solar cell with increased efficiency according to claim 1, wherein the diffraction grating is a one-dimensional grating.

3. The method for making a solar cell with increased efficiency according to claim 1, wherein the diffraction grating is a two-dimensional grating.

4. The method for making a solar cell with increased efficiency according to claim 1, wherein the diffraction grating is defined in the semiconductor material itself by etching into the n type material.

5. The method for making a solar cell with increased efficiency according to claim 1, wherein the diffraction grating is defined in the semiconductor material itself by etching into the p type material.

6. The method for making a solar cell with increased efficiency according to claim 1, wherein the diffraction grating is created by performing a sequence of lithography, wet etch or dry etch including ion milling, plasma etching or reactive ion etching.

7. The method for making a solar cell with increased efficiency according to claim 1, wherein the spacing of a two-dimension diffraction grating in the two directions is different from each other such that maximum ninety-degree diffraction is done for two different wavelengths.

8. The method for making a solar cell with increased efficiency according to claim 1, wherein the spacing of a two dimensional diffraction grating in the two directions is the same.

9. The method for making a solar cell with increased efficiency according to claim 1, wherein the spacing of a two dimensional diffraction grating in the two directions is different from each other.

10. The method for making a solar cell with increased efficiency according to claim 1, wherein the diffraction grating is not defined in the semiconductor material itself but rather by etching on the substrate used to deposit the active device.

11. The method for making a solar cell with increased efficiency according to claim 1, wherein the diffraction grating is defined in a silicon substrate used to deposit the solar cell device on which the solar cell materials are deposited.

12. The method for making a solar cell with increased efficiency according to claim 1, wherein the thickness of the n layer is between 0.05 and one micron and the thickness of the p layer is between 5-100 microns.

13. A method for making a solar cell with increased efficiency in which the solar cell is made in a standard way with two disparate semiconductor materials (two semiconductor materials with different band-gaps like CdTe/CdS, CdTe/CdZnTe, Copper Indium Gallium Selenide, GaAs/AlGaAs) and a conducting layer on a top surface and a bottom surface except that the solar cell has a diffraction grating whose spacing is equal to or slightly lower than a wavelength corresponding to an energy gap of the semiconductor material and the thickness of the semiconductor layers is reduced such that electrons and holes generated by an absorption of an incident radiation do not have to traverse large distances in order to be collected and get trapped or lost in a process of being collected due to the fact that the incident radiation is being diffracted in a plane of a device.

14. The method for making a solar cell with increased efficiency according to claim 13, wherein the diffraction grating is a one-dimensional grating.

15. The method for making a solar cell with increased efficiency according to claim 13, wherein the diffraction grating is a two-dimensional grating.

16. The method for making a solar cell with increased efficiency according to claim 13, wherein the diffraction grating is created by performing a sequence of lithography, wet etch or dry etch including ion milling, plasma etching or reactive ion etching.

17. The method for making a solar cell with increased efficiency according to claim 13, wherein the spacing of a two-dimension diffraction grating in the two directions is different from each other.

18. The method for making a solar cell with increased efficiency according to claim 13, wherein the spacing of a two dimensional diffraction grating in the two directions is different from each other and different from the wavelength corresponding to the energy gap of the semiconductor material.

19. The method for making a solar cell with increased efficiency according to claim 13, wherein the spacing of a two dimensional diffraction grating in the two directions be different from each other and equal to (or slightly less than) the wavelengths corresponding the energy gaps of the two different materials used to make the solar cell.

20. The method for making a solar cell with increased efficiency according to claim 13, wherein a diffraction grating is defined by etching into the transparent conductor (Indium Tin Oxide or fluorine doped Tin oxide), which is deposited on top of a transparent substrate.

21. The method for making a solar cell with increased efficiency according to claim 13, wherein a diffraction grating is defined in the glass panel used to act as a substrate to deposit the solar cell device and through which the incident radiation traverse through in order for it reach the semiconductor solar device by lithography and etching processes.

22. The method for making a solar cell with increased efficiency according to claim 13, wherein a diffraction grating is defined at the interface between two semiconductor materials of different band-gaps by etching into the first deposited material.

23. A method for making a solar cell with increased efficiency in which the solar cell is made with amorphous and/or polycrystalline silicon deposited on a glass panel with a conducting layer and the solar cell has a diffraction grating whose spacing is equal to or slightly lower than the wavelength corresponding to an energy gap of a semiconductor material and a thickness of the semiconductor layers is reduced such that electrons and holes generated by an absorption of a radiation do not have to traverse large distances in order to be collected and get trapped and lost in a process of being collected due to the fact that the incident radiation is being diffracted in a plane of a device.

24. The method for making a solar cell with increased efficiency according to claim 23, wherein the diffraction grating is a one-dimensional grating.

25. The method for making a solar cell with increased efficiency according to claim 23, wherein the diffraction grating is a two-dimensional grating.

26. The method for making a solar cell with increased efficiency according to claim 23, wherein the diffraction grating is created by performing a sequence of lithography, wet etch or dry etch including ion milling, plasma etching or reactive ion etching.

27. The method for making a solar cell with increased efficiency according to claim 23, wherein the spacing of a two-dimension diffraction grating in the two directions is different from each other.

28. The method for making a solar cell with increased efficiency according to claim 23, wherein the spacing of a two dimensional diffraction grating in the two directions is different from each other and different from the wavelength corresponding to the energy gap of the semiconductor material.

29. The method for making a solar cell with increased efficiency according to claim 23, wherein the spacing of a two dimensional diffraction grating in the two directions be different from each other and equal to (or slightly less than) the wavelengths corresponding the energy gaps of amorphous and polycrystalline materials used to make the solar cell.

30. The method for making a solar cell with increased efficiency according to claim 23, wherein a diffraction grating is defined in the glass panel used to act as a substrate to deposit the solar cell device and through which the incident radiation traverse through in order for it reach the semiconductor solar device by lithography and etching processes.

31. The method for making a solar cell with increased efficiency according to claim 23, wherein the diffraction grating is defined by etching into the transparent conductor (Indium Tin Oxide or fluorine doped Tin oxide), which is deposited on top of a transparent substrate.

* * * * *